(12) United States Patent
Chen

(10) Patent No.: US 12,063,807 B2
(45) Date of Patent: Aug. 13, 2024

(54) PROTECTION STRUCTURE OF DISPLAY PANEL AND DISPLAY DEVICE

(71) Applicant: KunShan Go-Visionox Opto-Electronics Co., Ltd., Jiangsu (CN)

(72) Inventor: Xiaohe Chen, Jiangsu (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 648 days.

(21) Appl. No.: 17/337,263

(22) Filed: Jun. 2, 2021

(65) Prior Publication Data

US 2021/0288288 A1    Sep. 16, 2021

Related U.S. Application Data

(63) Continuation of application No. PCT/CN2019/118928, filed on Nov. 15, 2019.

(30) Foreign Application Priority Data

May 16, 2019   (CN) .......................... 201910406923.X

(51) Int. Cl.
*H10K 50/844*    (2023.01)
*H10K 50/842*    (2023.01)

(52) U.S. Cl.
CPC ....... *H10K 50/844* (2023.02); *H10K 50/8426* (2023.02)

(58) Field of Classification Search
CPC ............. H10K 50/844; H10K 50/8426; H10K 59/8722; H01L 23/562
See application file for complete search history.

(56) References Cited

U.S. PATENT DOCUMENTS 10,234,999 B2 *   3/2019   Baek ................... G06F 3/0443
2012/0056530 A1   3/2012   Yee
(Continued)

FOREIGN PATENT DOCUMENTS

CN   107464824 A   12/2017
CN   107563306 A    1/2018
(Continued)

OTHER PUBLICATIONS

European Search Report for EP Application No. 19928833.3 dated Apr. 7, 2022.
(Continued)

*Primary Examiner* — Caleb E Henry
(74) *Attorney, Agent, or Firm* — Rimon PC

(57) ABSTRACT

The present disclosure provides a display panel and a display device. The display panel includes: a cover plate; a substrate, spaced apart from the cover plate, wherein an edge of the substrate is connected to an edge of the cover plate through an adhesive member, and the substrate comprises a first region enclosed and defined by the adhesive member; and a protective layer, disposed at a side of the substrate away from the cover plate. An impact abruption structure is configured on the protective layer or configured between the protective layer and the adhesive member, and an impact is applied towards the substrate. In this way, a possibility of the adhesive member being damaged while the display panel receiving the impact may be reduced.

20 Claims, 3 Drawing Sheets

(56) References Cited

U.S. PATENT DOCUMENTS

| | | | |
|---|---|---|---|
| 2013/0229108 A1 | 9/2013 | Chen | |
| 2014/0159569 A1 | 6/2014 | Hwang | |
| 2016/0172623 A1 | 6/2016 | Lee | |
| 2017/0357354 A1* | 12/2017 | Lim | G06F 3/0445 |
| 2018/0088700 A1* | 3/2018 | Cao | G06F 3/0445 |
| 2018/0095582 A1* | 4/2018 | Hwang | G06F 3/0412 |
| 2018/0113542 A1* | 4/2018 | Cao | G02F 1/133308 |
| 2018/0356663 A1 | 12/2018 | Zhang et al. | |
| 2019/0012024 A1* | 1/2019 | Tian | G02B 5/201 |
| 2019/0129216 A1* | 5/2019 | Tsai | G06F 3/04184 |
| 2021/0200352 A1* | 7/2021 | Wang | B32B 7/12 |

FOREIGN PATENT DOCUMENTS

| | | |
|---|---|---|
| CN | 207381435 A | 5/2018 |
| CN | 108281566 A | 7/2018 |
| CN | 109037468 A | 12/2018 |
| CN | 109119549 A | 1/2019 |
| CN | 110190032 A | 8/2019 |
| JP | 2018-036514 A | 3/2018 |
| JP | 2019-049936 A | 3/2019 |

OTHER PUBLICATIONS

PCT International Search Report for International Application No. PCT/CN2019/118928 dated Feb. 24, 2020.
PCT Written opinion for International Application No. PCT/CN2019/118928 dated Feb. 24, 2020.
Chinese First Office Action for CN Application No. 201910406923.X dated Feb. 17, 2020.
Taiwan First Office Action for Application No. 108142624 dated Jul. 14, 2020.

* cited by examiner

PROTECTION STRUCTURE OF DISPLAY PANEL AND DISPLAY DEVICE

CROSS-REFERENCE TO RELATED APPLICATIONS

This application is a continuation-application of International (PCT) Patent Application No. PCT/CN2019/118928 filed on Nov. 15, 2019, which claims a foreign priority of Chinese Patent Application No. 201910406923.X, filed on May 16, 2019 in the National Intellectual Property Administration of China, the content of which is herein incorporated by reference in its entirety.

TECHNICAL FIELD

The present disclosure generally relates to the technical field of displaying, and particularly to a display panel and a display device.

BACKGROUND

In the technical field of organic light emitting diode (Organic Light Emitting Didoe, referred to as OLED) displaying, in order to prevent moisture, oxygen, dust, and the like, from damaging an OLED element, a suitable form of packaging may be applied to isolate the OLED element from an external environment to improve service life of the OLED element.

Glass frit packaging is a form of packaging that is often applied for an OLED hard screen. In detail, a substrate and a cover plate are spaced apart from each other, an edge of the substrate and an edge of the cover plate are sealed by the frit, and a space defined by the substrate and the cover plate are vacuum or filled with inert gas. In this way, the OLED element disposed between the substrate and the cover plate is isolated from the external environment.

The applicant of the present disclosure discovered in long-term research that, since the substrate and the cover plate are substantially supported by the frit, when the display panel is dropped with a back of the display panel facing the ground, strength provided by the frit is insufficient, and the frit is easily damaged in response to an external impact, causing failure of the display panel.

SUMMARY OF THE DISCLOSURE

The present disclosure provides a display panel and a display device to reduce a possibility of an adhesive element being damaged when the display panel is impacted.

In a first aspect of the present disclosure, a display panel is provided and includes: a cover plate, a substrate, and a protective layer. The substrate is spaced apart from the cover plate. An edge of the substrate is connected to an edge of the cover plate through an adhesive member, and the substrate comprises a first region enclosed and defined by the adhesive member. The protective layer is disposed on a side of the substrate away from the cover plate. An impact abruption structure is configured on the protective layer or configured between the protective layer and the adhesive member.

In a second aspect of the present disclosure, a display device is provided and includes a display panel and a shell disposed at a periphery of the display panel. The display panel includes: a cover plate, a substrate, and a first protective layer. The substrate is spaced apart from the cover plate. An edge of the substrate is connected to an edge of the cover plate through an adhesive member, and the substrate includes a first region enclosed and defined by the adhesive member. The first protective layer is disposed on a side of the substrate away from the cover plate. An impact abruption structure is configured on the first protective layer or configured between the first protective layer and the adhesive member. The impact abruption structure includes a side wall of the first protective layer and an outer surface of the substrate. An orthographic projection of the first protective layer onto the substrate is completely located in the first region. A distance exists between an orthographic projection of the side wall of the first protective layer onto the substrate and an orthographic projection of the adhesive member onto the substrate.

According to the present disclosure, the display panel is configured with an impact abruption structure. The impact abruption structure may be disposed on the protective layer or disposed between the protective layer and the adhesive member. When the display panel receives an impact, and the impact applies towards the substrate, the impact may be weakened by the impact abruption structure, such that the impact reaching the adhesive member may be reduced, and a possibility of the adhesive member being damaged may be reduced, improving a capability of the display panel resistant against the impact while the panel dropping with a back of the panel facing the ground.

BRIEF DESCRIPTION OF THE DRAWINGS

In order to illustrate technical solutions of embodiments of the present disclosure more clearly, accompanying drawings required for illustrating the embodiments will be described in brief. Obviously, the following drawings show only some embodiments of the present disclosure, any ordinary skilled person in the art may obtain other drawings based on the following drawings without making any creative work.

DETAILED DESCRIPTION

The technical solutions according to the embodiments of the present application will be described clearly and completely by referring to the accompanying drawings of the embodiments of the present application. Obviously, the described embodiments are only a part of, but not all of, the embodiments of the present application. Based on the embodiments in the present disclosure, other embodiments may be obtained by any ordinary skilled person in the art without creative work, and the obtained other embodiments shall fall within the scope of the present disclosure.

Figure 1:
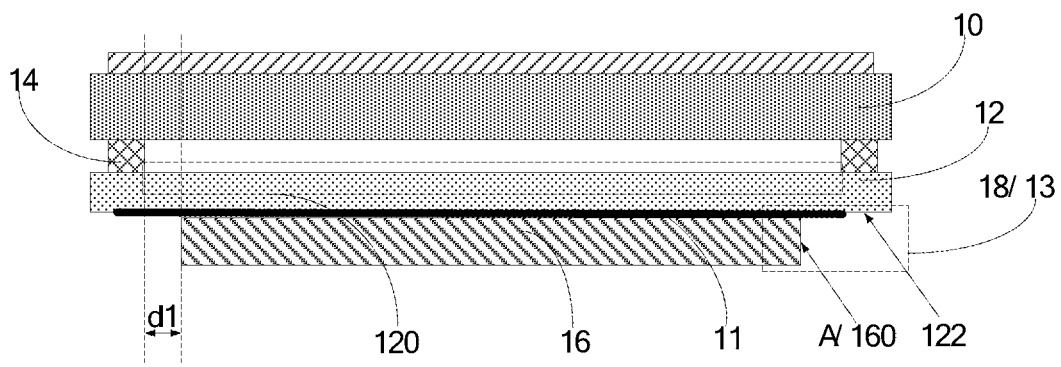
FIG. 1 is a structural schematic view of a display panel according to an embodiment of the present disclosure.

As shown in FIG. 1, FIG. 1 is a structural schematic view of a display panel according to an embodiment of the present disclosure. The display panel may be applied in various displaying manners, such as an OLED displaying, a quantum dot displaying, a micro-LED displaying, and the like. The display panel may include following components.

A cover plate 10 may be arranged. In the present embodiment, the cover plate 10 may be a glass cover plate. The glass cover plate may have advantages of chemical stability, electrical insulation and compactness.

A substrate 12 may be arranged and spaced apart from the cover plate 10. An edge of the substrate 12 may be connected to an edge of the cover plate 10 through an adhesive member 14. The substrate 12 may include a first region 120 enclosed and defined by the adhesive member 14. In the present embodiment, the substrate 12 may be a glass substrate. The glass substrate may have advantages of chemical stability, electrical insulation and compactness. An anode, an organic light emitting layer (such as an OLED element and the like), a cathode, and the like may be stacked sequentially and disposed between the substrate 12 and the cover plate 10. When the edge of the substrate 12 and the edge of the cover plate 10 are sealed by the adhesive member 14, a sealed space may be defined between the substrate 12 and the cover plate 10. When the sealed space is vacuum or filled with inert gas, the anode, the organic light emitting layer, and the cathode may be isolated from an external environment effectively to reduce a possibility of moisture corrosion. In order to allow the substrate 12 to be spaced apart from the cover plate 10, a supportive member may be disposed between the substrate 12 and the cover plate 10. Further, the adhesive member 14 may be made of frit material. The frit material may typically include glass powder, filler, adhesive/resin, and the like. In other embodiments, the adhesive member 14 may be made of other types of material.

A protective layer 16 may be arranged on a side of the substrate 12 away from the cover plate 10. An impact abruption structure 13 may be configured on the protective layer 16 or configured between the protective layer 16 and the adhesive member 14. The impact may be applied towards the substrate 12. For example, a direction of the impact may extend from the substrate 12 to the cover plate 10: or the direction of the impact may be perpendicular to the substrate 12: or the direction of the impact may be inclined to the substrate 12, and an angle between the direction and a surface of the substrate 12 may be an acute angle. When the display panel receives the impact that is applied towards the substrate 12, and when the direction of the impact extends from the substrate 12 to the cover plate 10, the impact may be weakened by the impact abruption structure 13, such that the impact reaching the adhesive member 14 may be reduced, a possibility of the adhesive member 14 being damaged may be reduced, and a capability of the display panel resistant against the impact while the panel dropping with a back of the panel facing the ground may be improved.

Further, in the present embodiment, the display panel may further include other components, such as a polarizing plate, disposed on a side of the cover plate 10 away from the substrate 12.

Figure 7:
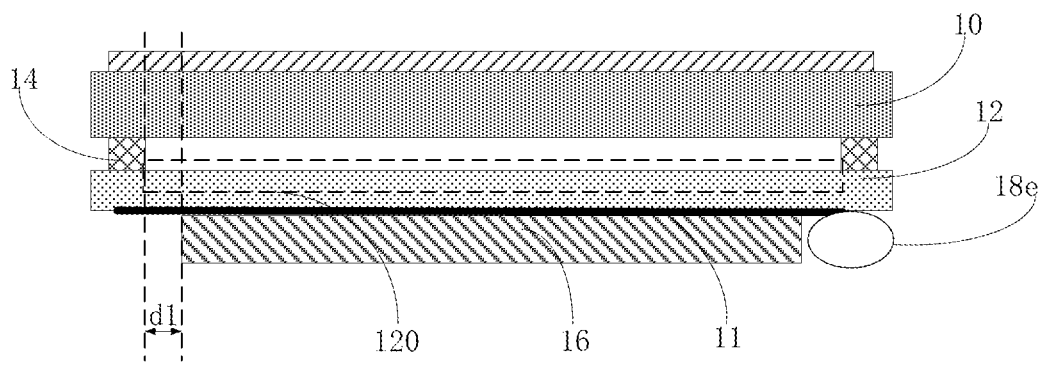
FIG. 7 is a structural schematic view of a display panel according to another embodiment of the present disclosure.

In one embodiment, as shown in FIG. 1, a stage portion 18 may be formed between the protective layer 16 and the substrate 12. The stage portion 18 may include at least one side wall protruding from an outer surface of the substrate 12. In the present embodiment, a side wall A will be taken as an example for description. An orthographic projection of the side wall A onto the substrate 12 may be located in the first region 120. The stage portion 18 may serve as the impact abruption structure 13. The stage portion 18 may be configured to allow a side of the substrate 12 to be covered by two protective layers 16 having different thicknesses. A thickness of the protective layer 16 corresponding to the first region 120 may be greater than that of the protective layer 16 corresponding to the adhesive member 14. That is, the stage portion 18 may be configured to allow the protective layer 16 to have a mismatch at a position corresponding to the adhesive member 14. When the display panel drops with the back of the display panel facing the ground, the protective layer 16 corresponding to the first region 120 may receive the impact directly, whereas the protective layer 16 or the substrate 12 at the position corresponding to the adhesive member 14 may not receive the impact directly, the adhesive member 14 may not be a direct impact point, such that the impact applied to the adhesive member 14 may be weakened to a large extent, and the capability of the display panel resistant against the impact may be improved. In addition, the above-mentioned means of enabling the stage portion 18 to serve as the impact abruption structure 13 may be achieved easily. In other embodiments, the impact abruption structure 13 may be configured by other means. For example, as shown in FIG. 7, an air bag 18e may be configured at a position of the protective layer 16 corresponding to the adhesive member 14 to buffer the impact reaching the adhesive member 14.

In the present embodiment, as shown in FIG. 1, the orthographic projection of the side wall A onto the substrate 12 may be located in the first region 120. There may be a distance d1 between the orthographic projection of the side wall A and an orthographic projection of the adhesive member 14 onto the substrate 12. The distance d1 may be in a range of 0.3 mm to 5 mm, such as 0.3 mm, 2 mm, 4 mm, 5 mm, and the like. In one aspect, the distance enables the adhesive member 14 not to be the direct impact point while the display panel dropping with the back facing the ground, and the adhesive member 14 may be impacted only if the substrate 12 vibrates transversely. In another aspect, the distance may reduce a possibility of the substrate 12 being damaged while dropping.

Figure 2:
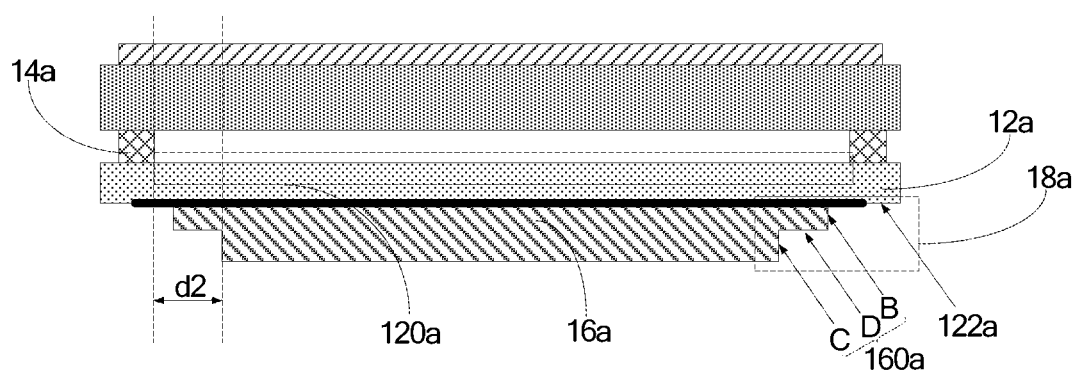
FIG. 2 is a structural schematic view of a display panel according to an embodiment of the present disclosure, where a stage portion includes two side walls.

In other embodiments, as shown in FIG. 2, FIG. 2 is a structural schematic view of a display panel according to another embodiment of the present disclosure. A stage portion 18a may include as least two side walls. In the present embodiment, side walls B and C will be taken as examples for illustration. Orthographic projections of the side walls B and C onto the substrate 12a may be located in the first region 120a. In this situation, there may be a distance d2 between orthographic projection of the side wall C, which is adjacent to a center of the display panel at most, and an orthographic projection of the adhesive member 14a onto the substrate 12a. The distance d2 may be in a range of 0.3 mm to 5 mm, such as 0.3 mm, 2 mm, 4 mm, 5 mm, and the like. The present embodiment may have the same advantages as the embodiment mentioned in the above.

In one application scenario, as shown in FIG. 1 and FIG. 2, the orthographic projection of the protective layer 16/16a onto the substrate 12/12a may be located in the first region 120/120a. That is, a thickness of the protective layer 16/16a at the position corresponding to the adhesive member 14/14a may be 0. The stage portion 18/18a may be formed by a side edge 160/160a of the protective layer 16/16a and the outer surface 122/122a of the substrate 12/12a. The number of stages included in the stage portion 18/18a may be one, two, three, and the like. When the number of stages included in the stage portion 18a is more than one, the side edge 160a of the protective layer 16a may include a plurality of side walls, such as the side wall B, the side wall C, and a surface D connected to the side walls B and C. In this way, the protective layer 16/16a may be achieved easily. Further, in the present embodiment, the protective layer 16/16a may be a cushion pad, such as a cushion foam, and the like. The cushion pad may further buffer the impact applied to the substrate 12/12a while the display panel dropping with the back facing the ground, such that the impact transferred through the substrate 12/12a reaching the adhesive member 14/14a may further be reduced.

Further, in the present embodiment, as shown in FIG. 1, the display panel may further include a light-shielding sheet 11 disposed between the protective layer 16 and the substrate 12. The orthographic projection of the light-shielding sheet 11 onto the substrate 12 may at least extend to reach the adhesive member 14. For example, the light-shielding sheet 11 may completely cover the substrate 12. The light-shielding sheet 11 may be made of non-transparent material, such as a black tape. The light-shielding sheet 11 may effectively reduce light leaking to a region of the substrate 12 uncovered by the protective layer 16. In other embodiments, when the protective layer 16 is made of the non-transparent material, the light-shielding sheet 11 may be configured to cover a portion of the substrate 12 uncovered by the protective layer 16 only.

Figure 3:
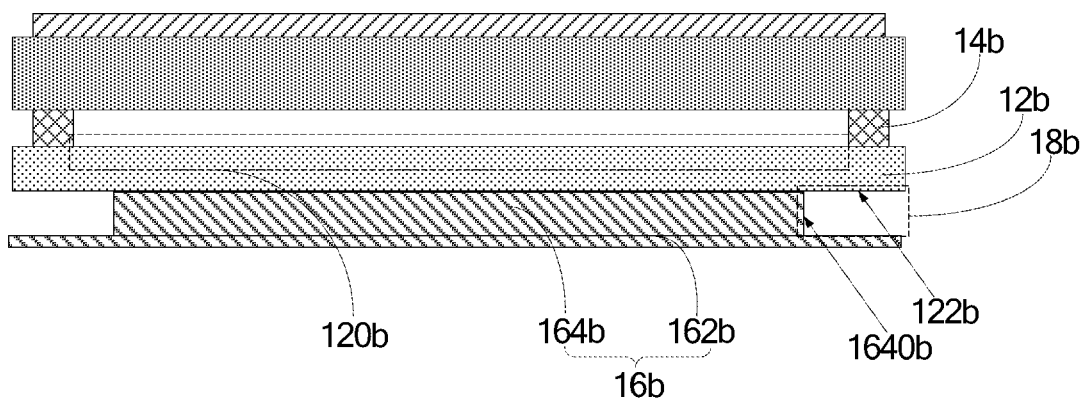
FIG. 3 is a structural schematic view of the display panel shown in FIG. 2, where an orthographic projection of a protective layer onto a substrate at least completely covers a first region.

In another application scenario, as shown in FIG. 3, FIG. 3 is a structural schematic view of a display panel according to still another embodiment of the present disclosure. The orthographic projection of the protective layer 16b onto the substrate 12b may at least completely cover the first region 120b. That is, the orthographic projection of the protective layer 16b onto the substrate 12b may not only cover the first region 120b, but also may cover a region out of the first region 120b. For example, the orthographic projection of the protective layer 16b onto the substrate 12b may completely cover the substrate 12b. The protective layer 16b may include a first layer 162b and a second layer 164b which are stacked together. The second layer 164b may be disposed between the first layer 162b and the substrate 12b. An area of the first layer 162b may be greater than that of the second layer 164b. An orthographic projection of the second layer 164b onto the substrate 12b may be located in the first region 120b. The stage portion 18b may be formed by a side edge 1640b of the second layer 164b and the outer surface 122b of the substrate 12b. The stage portion 18b formed by the above-mentioned means may be achieved easily. The first layer 162b and the second layer 164b of the protective layer 16b may be configured individually and may be connected via an adhesive element. By configuring the first and the second layers individually, assembling the display panel in a subsequent process may be performed easily. In other embodiments, the first layer 162b and the second layer 164b may be integrally configured as an overall structure. That is, the protective layer 16b may be formed by a proper mould or by a proper cutting process. In addition, in the present embodiment, the protective layer 16b may be the cushion pad, such as the cushion foam and the like. The cushion pad may further reduce the impact applied to the substrate 12b while the display panel dropping with the back facing the ground, such that the impact transferred through the substrate 12b reaching the adhesive member 14b may further be reduced.

Figure 4:
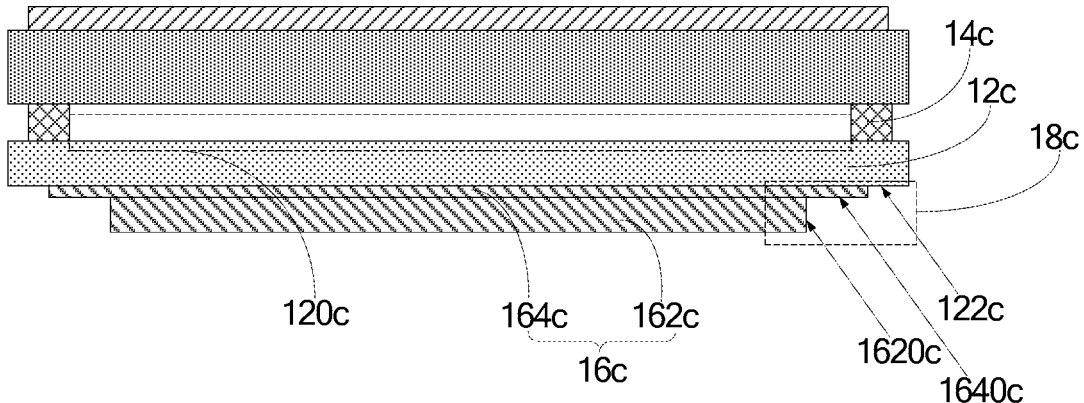
FIG. 4 is a structural schematic view of the display panel shown in FIG. 3, where the orthographic projection of the protective layer onto the substrate completely covers the substrate.

In still another application scenario, as shown in FIG. 4, FIG. 4 is a structural schematic view of a display panel according to still another embodiment of the present disclosure. The orthographic projection of the protective layer 16c onto the substrate 12c may at least completely cover the first region 120c and a region out of the first region 120c. That is, the orthographic projection of the protective layer 16c onto the substrate 12c may not only cover the first region 120c, but also may cover a region out of the first region 120c. For example, the orthographic projection of the protective layer 16c onto the substrate 12c completely covers the substrate 12c. The protective layer 16c may include a first layer 162c and a second layer 164c which are stacked together. The second layer 164c may be disposed between the first layer 162c and the substrate 12c. An area of the first layer 162c may be less than that of the second layer 164c. An orthographic projection of the first layer 162c onto the substrate 12c may be located in the first region 120c. The stage portion 18c may be formed by a side edge 1620c of the first layer 162c, a side edge 1640c of the second layer 164c, and the outer surface 122c of the substrate 12c. The stage portion 18c formed by the above-mentioned means may be achieved easily. The first layer 162c and the second layer 164c of the protective layer 16c may be configured individually and may be connected via an adhesive element. By configuring the first and the second layers individually, assembling the display panel in a subsequent process may be performed easily. In other embodiments, the first layer 162c and the second layer 164c may be integrally configured as an overall structure. That is, the protective layer 16c may be formed by a proper mould or by a proper cutting process. Further, in the present embodiment, the protective layer 16c may be the cushion pad, such as the cushion foam and the like. The cushion pad may further reduce the impact applied to the substrate 12c while the display panel dropping with the back facing the ground, such that the impact transferred through the substrate 12c reaching the adhesive member 14c may further be reduced.

Figure 5:
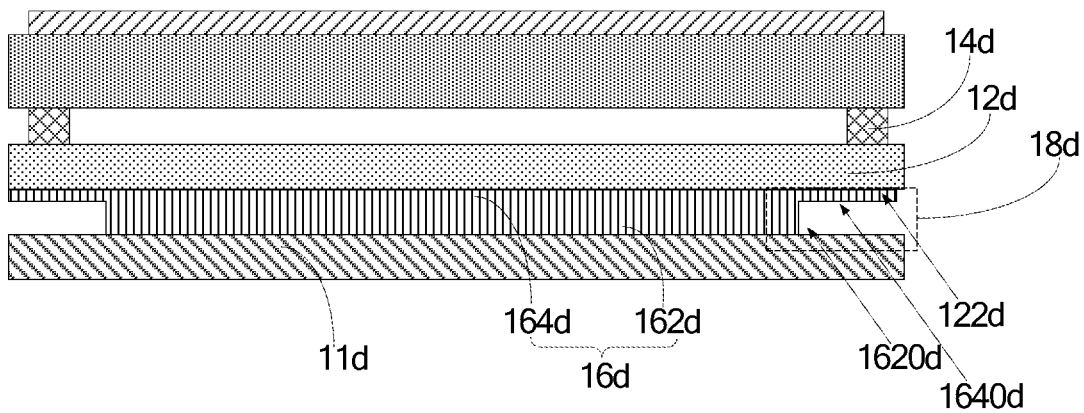
FIG. 5 is a structural schematic view of the display panel shown in FIG. 1, where the protective layer is a protective coating.

In still another embodiment, as shown in FIG. 5, FIG. 5 is a structural schematic view of a display panel according to still another embodiment of the present disclosure. Compared to the above embodiment, the protective layer 16d in the present embodiment may be a layer of coating, such as a coating of silicone dioxide sol and the like. The protective coating may improve surface intensity of the substrate 12d to reduce a possibility of the substrate 12d being cracked when receiving the impact. A structure of the protective layer 16d may be similar to that shown in FIGS. 1 to 4. When the protective layer 16d is configured as the one shown in FIGS. 3 and 4, that is when the protective layer 16d includes a first layer 162d and a second layer 164d, a step-by-step coating may be performed to obtain the first layer 162d and the second layer 164d. Further, in the present embodiment, the display panel may further include a cushion pad 11d, disposed at a side of the protective coating away from the substrate 12d. The cushion pad 11d may further buffer the impact applied to the substrate 12d while the display panel dropping with the back facing the ground, such that the impact transferred through the substrate 12d reaching the adhesive member 14d may further be reduced. In the present embodiment, the protective coating on an outer side of the substrate 12d may serve as a stage portion 18d, the stage portion 18d may be formed by a side edge 1620d of the first layer 162d, a side edge 1640d of the second layer 164d, and the outer surface 122d of the substrate 12d, and the stage portion 18d may protect the adhesive member 14d. Compared to the embodiments shown in FIG. 3 and FIG. 4, the cushion pad in the present embodiment may not be required to be configured twice, such that complexity of assembling the display panel in a subsequent process may be reduced.

In other embodiments, a thickness of the protective coating shown in FIG. 5 may be uniform, and an orthographic projection of the protective coating onto the substrate may cover the substrate. A structure of the cushion pad disposed at a side of the protective coating may refer to that shown in FIGS. 1 to 4.

Specific experimental data will be described in the following to verify the display panel provided in the present disclosure.

A test method that is performed includes: taking a jig to simulate the display panel dropping with the back facing the ground; and dropping the display panel respectively twice from a height of 0.7 meters, a height of 0.8 meters, and a height of 0.9 meters.

When the display panels in the art drop with the back facing the ground from the height of 0.7 m, 4 out of 5 display panels are broken. When the display panels provided in the present disclosure drop with the back facing the ground from the height of 0.7 m, 0 out of 5 display panels are broken. When the display panels provided in the present disclosure drop with the back facing the ground from the height of 0.8 m, 0 out of 5 display panels are broken. When the display panels provided in the present disclosure drop with the back facing the ground from the height of 0.9 m, 5 out of 5 display panels are broken.

According to the above test results, when the display panel provided in the present disclosure drops with the back facing the ground, the impact applied to the adhesive member may be reduced, a possibility of the adhesive member being damaged may be reduced, such that a capability of the display panel resistant against the external impact may be improved.

Figure 6:
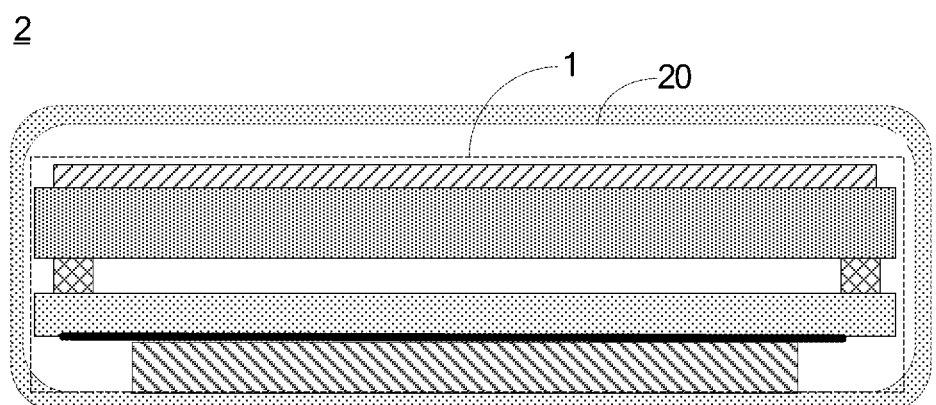
FIG. 6 is a structural schematic view of a display device according to an embodiment of the present disclosure.

As shown in FIG. 6, FIG. 6 is a structural schematic view of a display device according to an embodiment of the present disclosure. The display device 2 may include the display panel 1 according to any one of the above embodiments and a shell 20 disposed at a periphery of the display panel 1. The display device 2 may be a mobile phone, a computer, and the like. When the display device 2 drops with the back facing the ground, the impact transferred through the shell 20 to the adhesive member may be weakened by the impact abruption structure, such that the impact reaching the adhesive member may be reduced, a possibility of the adhesive member being damaged may be reduced, and the capability of the display device 2 resistant against the impact may be improved.

The above description shows only embodiments of the present disclosure, and does not limit the scope of the present disclosure. Any equivalent structure or equivalent process transformation made based on the content of the present description and drawings, directly or indirectly applied to other related art, should be included in the scope of the present disclosure.

What is claimed is:

1. A display panel, comprising:
  a cover plate;
  a substrate, spaced apart from the cover plate, an edge of the substrate being connected to an edge of the cover plate through an adhesive member, and the substrate comprising a first region enclosed by the adhesive member;
  a protective layer, disposed on a side of the substrate away from the cover plate; and
  a light-shielding sheet disposed between the protective layer and the substrate;
  wherein an impact abruption structure is configured on the protective layer or configured between the protective layer and the adhesive member, and an orthographic projection of the light-shielding sheet onto the substrate at least extends to reach the adhesive member.

2. The display panel according to claim 1, wherein a stage portion serves as the impact abruption structure and is configured between the protective layer and the substrate;
  the stage portion comprises at least one side wall protruding from an outer surface of the substrate; and an orthographic projection of the at least one side wall onto the substrate is located in the first region.

3. The display panel according to claim 2, wherein
  the at least one side wall comprises one side wall, an orthographic projection of the one side wall onto the substrate is located in the first region;
  a distance between the orthographic projection of the one side wall onto the substrate and an orthographic projection of the adhesive member onto the substrate is in a range from 0.3 mm to 5 mm.

4. The display panel according to claim 2, wherein
  the at least one side wall comprises at least two side walls, orthographic projections of the at least two side walls onto the substrate are located in the first region;
  a distance between the orthographic projection of one of the at least two side walls closest to a center of the display panel onto the substrate and an orthographic projection of the adhesive member onto the substrate is in a range from 0.3 mm to 5 mm.

5. The display panel according to claim 2, wherein
  an orthographic projection of the protective layer onto the substrate is located in the first region; and
  the stage portion comprises a side edge of the protective layer and the outer surface of the substrate.

6. The display panel according to claim 2, wherein
  an orthographic projection of the protective layer onto the substrate at least completely covers the first region;
  the protective layer comprises a first layer and a second layer which are stacked together, the second layer is disposed between the first layer and the substrate;
  an area of the first layer is greater than an area of the second layer;
  an orthographic projection of the second layer onto the substrate is located in the first region; and
  the stage portion comprises a side edge of the second layer and the outer surface of the substrate.

7. The display panel according to claim 6, wherein
  the first layer and the second layer are configured as individual components and are connected via an adhesive element.

8. The display panel according to claim 6, wherein the first layer and the second layer are integrally configured as an overall structure.

9. The display panel according to claim 2, wherein
  an orthographic projection of the protective layer onto the substrate at least completely covers the first region;
  the protective layer comprises a first layer and a second layer which are stacked together, the second layer is disposed between the first layer and the substrate;
  an area of the first layer is less than an area of the second layer;
  an orthographic projection of the first layer onto the substrate is located in the first region; and
  the first layer, the second layer, and the outer surface of the substrate forms the stage portion.

10. The display panel according to claim 1, wherein the orthographic projection of the light-shielding sheet onto the substrate completely covers the substrate.

11. The display panel according to claim 1, wherein the protective layer is a cushion pad.

12. The display panel according to claim 1, wherein the protective layer is a protective coating, the display panel further comprises a cushion pad, and the cushion pad is disposed at a side of the protective coating away from the substrate.

13. The display panel according to claim 1, wherein an air bag is configured at a position of the protective layer corresponding to the adhesive member, and the air bag serves as the impact abruption structure.

14. A display panel comprises:
a cover plate;
a substrate, spaced apart from the cover plate, wherein an edge of the substrate is connected to an edge of the cover plate through an adhesive member, and the substrate comprises a first region enclosed by the adhesive member; and
a first protective layer, disposed on a side of the substrate away from the cover plate;
wherein an impact abruption structure is configured on the first protective layer or configured between the first protective layer and the adhesive member;
the impact abruption structure comprises a side wall of the first protective layer and an outer surface of the substrate;
an orthographic projection of the first protective layer onto the substrate is completely located in the first region.

15. The display panel according to claim 14, wherein
an end portion of the first protective layer adjacent to the edge of the substrate has an uneven thickness;
the side wall at the end portion of the first protective layer comprises two side walls separated from each other; and
the impact abruption structure comprises the two separated side walls and the outer surface of the substrate.

16. The display panel according to claim 14, further comprising a second protective layer disposed on and completely covers a side of the first protective layer away from the substrate, wherein the second protective layer comprises an end portion extending out of the first protectively; and
the impact abruption structure comprises the end portion of the second protective layer, the side wall of the first protective layer, and the outer surface of the substrate.

17. The display panel according to claim 14, further comprising a second protective layer disposed between the first protective layer and the substrate, wherein
the first protective layer covers a portion of the second protective layer;
an end portion of the second protective layer protrudes out of the side wall of the first protective layer; and
the impact abruption structure comprises the side wall of the first protective layer, the end portion of the second protective layer, and the outer surface of the substrate.

18. The display panel according to claim 17, wherein the first protective layer and the second protective layer are configured as individual components and are connected via an adhesive element.

19. A display panel, comprising:
a cover plate;
a substrate, spaced apart from the cover plate, an edge of the substrate being connected to an edge of the cover plate through an adhesive member, and the substrate comprising a first region enclosed by the adhesive member; and
a protective layer, disposed on a side of the substrate away from the cover plate; and
a light-shielding sheet disposed between the protective layer and the substrate;
wherein an impact abruption structure is configured on the protective layer or configured between the protective layer and the adhesive member, and a projection of the light-shielding sheet onto the substrate completely covers the substrate.

20. The display panel according to claim 19, wherein a stage portion serves as the impact abruption structure and is configured between the protective layer and the substrate;
the stage portion comprises at least one side wall protruding from an outer surface of the substrate; and an orthographic projection of the at least one side wall onto the substrate is located in the first region.

* * * * *